(12) United States Patent
Cheng et al.

(10) Patent No.: US 11,056,316 B2
(45) Date of Patent: Jul. 6, 2021

(54) RADIO FREQUENCY PULSE MATCHING METHOD AND DEVICE THEREOF AND PULSING PLASMA GENERATION SYSTEM

(71) Applicant: BEIJING NAURA MICROELECTRONICS EQUIPMENT CO., LTD., Beijing (CN)

(72) Inventors: Xiaoyang Cheng, Beijing (CN); Gang Wei, Beijing (CN); Jing Wei, Beijing (CN); Jinzhi Bai, Beijing (CN); Jing Yang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 17/134,113

(22) Filed: Dec. 24, 2020

(65) Prior Publication Data

US 2021/0118651 A1 Apr. 22, 2021

Related U.S. Application Data

(63) Continuation of application No. PCT/CN2019/092075, filed on Jun. 20, 2019.

(30) Foreign Application Priority Data

Jun. 27, 2018 (CN) .......................... 201810678471.6

(51) Int. Cl.
*H01J 37/32* (2006.01)
*H05H 1/46* (2006.01)

(52) U.S. Cl.
CPC ...... *H01J 37/32183* (2013.01); *H01J 37/321* (2013.01); *H05H 1/46* (2013.01)

(58) Field of Classification Search
None
See application file for complete search history.

(56) References Cited

U.S. PATENT DOCUMENTS 9,230,819 B2 * 1/2016 Paterson ........... H01L 21/32137
9,275,870 B2 * 3/2016 Xu ..................... H01J 37/32165
(Continued)

FOREIGN PATENT DOCUMENTS

| CN | 102027810 A | 4/2011 |
| CN | 103327724 A | 9/2013 |

(Continued)

OTHER PUBLICATIONS

World Intellectual Property Organization (WIPO) International Search Report for PCT/CN2019/092075 Sep. 29, 2019 5 Pages.
(Continued)

*Primary Examiner* — Amy Cohen Johnson
*Assistant Examiner* — Srinivas Sathiraju
(74) *Attorney, Agent, or Firm* — Anova Law Group, PLLC

(57) ABSTRACT

A radio frequency (RF) pulse matching method includes presetting a matching threshold and initializing a pulse count value to a pulse reference value and loading pulse power to an upper electrode and a lower electrode. The upper electrode includes an upper RF power supply and a corresponding upper matching device. The lower electrode includes a lower RF power supply and a corresponding lower matching device. The method further includes collecting a pulse signal of the pulse power and calculating a matching parameter according to the pulse signal, determining a magnitude of the matching parameter relative to the matching threshold and resetting the pulse count value, causing the upper matching device to perform matching on the upper RF power supply or the lower matching device to perform
(Continued)

matching on the lower RF power supply, and repeating processes until the upper RF power supply and the lower RF power supply are matched.

16 Claims, 11 Drawing Sheets

(56) References Cited

U.S. PATENT DOCUMENTS

| | | | | |
|---|---|---|---|---|
| 9,355,822 B2* | 5/2016 | Yamada | | H01J 37/32165 |
| 9,408,288 B2* | 8/2016 | Valcore, Jr. | | H01J 37/32174 |
| 9,455,153 B2* | 9/2016 | Koguchi | | H01J 37/32146 |
| 9,711,332 B2* | 7/2017 | Howald | | G06F 30/36 |
| 9,899,191 B2* | 2/2018 | Yamazawa | | H01L 21/67109 |
| 9,947,513 B2* | 4/2018 | Valcore, Jr. | | H05H 1/46 |
| 10,231,321 B2* | 3/2019 | Valcore, Jr. | | H03J 7/00 |
| 10,242,849 B2* | 3/2019 | Kabouzi | | H01J 37/32532 |
| 10,340,122 B2* | 7/2019 | Chen | | H01J 37/32183 |
| 10,622,224 B2* | 4/2020 | She | | H01J 37/321 |
| 10,643,822 B2* | 5/2020 | Cheng | | H01J 37/32146 |
| 10,699,881 B2* | 6/2020 | Wei | | H01J 37/32183 |
| 10,748,748 B2* | 8/2020 | Valcore, Jr. | | H01J 37/32146 |
| 10,937,672 B2* | 3/2021 | Zhang | | H05B 3/0047 |
| 2013/0256119 A1* | 10/2013 | Yang | | C23C 14/3485 |
| | | | | 204/192.12 |
| 2014/0076713 A1* | 3/2014 | Valcore, Jr. | | H01J 37/32174 |
| | | | | 204/164 |
| 2014/0106572 A1* | 4/2014 | Xu | | H01J 37/32183 |
| | | | | 438/714 |
| 2015/0048740 A1* | 2/2015 | Valcore, Jr. | | H01J 37/32082 |
| | | | | 315/111.21 |
| 2015/0206716 A1* | 7/2015 | Kim | | H01J 37/32183 |
| | | | | 156/345.48 |
| 2016/0126068 A1* | 5/2016 | Lee | | H01J 37/32091 |
| | | | | 156/345.25 |
| 2016/0276137 A1* | 9/2016 | Valcore, Jr. | | H01J 37/32082 |
| 2016/0322202 A1* | 11/2016 | Valcore, Jr. | | H01J 37/32174 |
| 2017/0162368 A1* | 6/2017 | Marakhtanov | | H01F 38/14 |
| 2017/0263419 A1* | 9/2017 | Valcore, Jr. | | H05H 1/46 |
| 2017/0294293 A1* | 10/2017 | Howald | | H01J 37/32926 |
| 2018/0033596 A1* | 2/2018 | Valcore, Jr. | | H01J 37/3255 |
| 2018/0294140 A1* | 10/2018 | Valcore, Jr. | | H03K 3/01 |
| 2019/0287764 A1* | 9/2019 | Long | | H01J 37/321 |
| 2020/0373126 A1* | 11/2020 | Na | | H01J 37/32183 |
| 2020/0381215 A1* | 12/2020 | Koshimizu | | H01J 37/32568 |
| 2021/0057188 A1* | 2/2021 | Nl | | H01J 37/32183 |

FOREIGN PATENT DOCUMENTS

| | | |
|---|---|---|
| CN | 103476196 A | 12/2013 |
| CN | 103681195 A | 3/2014 |
| CN | 103730316 A | 4/2014 |
| CN | 103943448 A | 7/2014 |
| CN | 105206494 A | 12/2015 |
| CN | 106449396 A | 2/2017 |
| CN | 106711005 A | 5/2017 |
| CN | 106876239 A | 6/2017 |

OTHER PUBLICATIONS

State Intellectual Property Office of the P.R.C (SIPO) Office Action 1 for 201810678471.6 dated Jul. 3, 2020 10 pages.

* cited by examiner

RADIO FREQUENCY PULSE MATCHING METHOD AND DEVICE THEREOF AND PULSING PLASMA GENERATION SYSTEM

CROSS-REFERENCES TO RELATED APPLICATIONS

This application is a continuation of International Application No. PCT/CN2019/092075, filed on Jun. 20, 2019, which claims priority to Chinese Application No. 201810678471.6 filed on Jun. 27, 2018, the entire contents of all of which are incorporated herein by reference.

TECHNICAL FIELD

The present disclosure generally relates to the semiconductor processing technology field and, more particularly, to a radio frequency (RF) pulse matching method, an RF pulse device, and a pulsing plasma generation system.

BACKGROUND

In semiconductor equipment, a pulsing plasma device configured for a silicon etching process usually applies an inductively coupled plasma (ICP) principle. A radio frequency (RF) power supply provides RF energy to a chamber to ionize a special gas in a high vacuum state to generate a plasma including active particles such as a large number of electrons, ions, active atoms, molecules, excited atoms, molecules, and free radicals. These active particles have a complicated interaction with a wafer arranged in the chamber and exposed in a plasma environment to cause various physical and chemical reactions on a surface of a wafer material. As such, the properties of the wafer surface change, and the etching process of the wafer is completed.

With the further development of an integrated circuit (IC), the existing technical solution cannot satisfy etching process requirements under 20 nm. An application of a new pulsing plasma technology improves a micronization process. The pulsing plasma technology is used to reduce a plasma induced damage (PID) caused by RF energy of a continuous wave to improve the loading effect of the etching process, increase an etching selectivity significantly, and enlarge process adjustment means and window. Therefore, the design of the pulsing plasma is very important.

SUMMARY

Embodiments of the present disclosure provide a radio frequency (RF) pulse matching method. The method includes presetting a matching threshold and initializing a pulse count value to a pulse reference value and loading pulse power to an upper electrode and a lower electrode. The upper electrode includes an upper RF power supply and a corresponding upper matching device. The lower electrode includes a lower RF power supply and a corresponding lower matching device. The method further includes collecting a pulse signal of the pulse power loaded by the upper RF power supply and calculating a matching parameter of the upper matching device according to the pulse signal, determining a magnitude of the matching parameter relative to the matching threshold and resetting the pulse count value, causing of the upper matching device to perform matching on the upper RF power supply or the lower matching device to perform matching on the lower RF power supply according to consistency of the reset pulse count value and the pulse reference value, and repeating processes until the upper RF power supply and the lower RF power supply are matched.

Embodiments of the present disclosure provide an RF pulse device. The device includes an upper electrode, a lower electrode, a pulsing synchronization line, a pulse matching time sequence control line, and a time sequence matching circuit. The upper electrode includes an upper RF power supply and a corresponding upper matching device. The lower electrode includes a lower RF power supply and a corresponding lower matching device. The pulsing synchronization line is configured to connect between the upper RF power supply and the lower RF power supply. The pulse matching time sequence control line and the time sequence matching circuit are arranged between the upper matching device and the lower matching device. The time matching circuit includes a pre-processing circuit, a loading circuit, a determination circuit, and a matching circuit. The pre-processing circuit is configured to preset a matching threshold and initialize a pulse count value to a pulse reference value. The loading circuit is configured to collect a pulse signal of pulse power loaded by the upper RF power supply and calculate a matching parameter of the upper matching device according to the pulse signal. The determination circuit is configured to determine a magnitude of the matching parameter relative to the matching threshold and reset the pulse count value according to the magnitude of the matching parameter relative to the matching threshold. The matching circuit is configured to cause the upper matching device to perform matching on the upper RF power supply or cause the lower matching device to perform the matching on the lower RF power supply according to consistency of the reset pulse count value and the pulse reference value.

Embodiments of the present disclosure provide a pulse plasma generation system including an RF pulse device. The device includes an upper electrode, a lower electrode, a pulsing synchronization line, a pulse matching time sequence control line, and a time sequence matching circuit. The upper electrode includes an upper RF power supply and a corresponding upper matching device. The lower electrode includes a lower RF power supply and a corresponding lower matching device. The pulsing synchronization line is configured to connect between the upper RF power supply and the lower RF power supply. The pulse matching time sequence control line and the time sequence matching circuit are arranged between the upper matching device and the lower matching device. The time matching circuit includes a pre-processing circuit, a loading circuit, a determination circuit, and a matching circuit. The pre-processing circuit is configured to preset a matching threshold and initialize a pulse count value to a pulse reference value. The loading circuit is configured to collect a pulse signal of pulse power loaded by the upper RF power supply and calculate a matching parameter of the upper matching device according to the pulse signal. The determination circuit is configured to determine a magnitude of the matching parameter relative to the matching threshold and reset the pulse count value according to the magnitude of the matching parameter relative to the matching threshold. The matching circuit is configured to cause the upper matching device to perform matching on the upper RF power supply or cause the lower matching device to perform the matching on the lower RF power supply according to consistency of the reset pulse count value and the pulse reference value.

REFERENCE NUMERALS

| | | |
|---|---|---|
| 1 Reaction chamber; | 2 Electrostatic chuck; | 3 Inductively coupled coil; |
| 31 Inner coil; | 32 Outer coil; | 4 Medium window; |
| 5 Wafer; | 6 Plasma; | 7 Upper matching device; |
| 70 Current distribution circuit; | | 8 Upper RF power supply; |
| 9 Lower matching device; | 10 Lower RF power supply; | 11 Nozzle; |
| 12 Pulsing synchronization line; | | 13 Pulse matching control line; |
| 14 Pre-processing circuit; | 15 Acquisition circuit; | 16 Determination circuit; |
| 17 Matching circuit. | | |

DETAILED DESCRIPTION OF THE EMBODIMENTS

To make those skilled in the art better understand a technical solution of the present disclosure, a radio frequency (RF) pulse matching method, an RF pulse device, and a pulse plasma generation system of the present disclosure are further described in detail in connection with accompanying drawings and specific embodiments.

Figure 1:
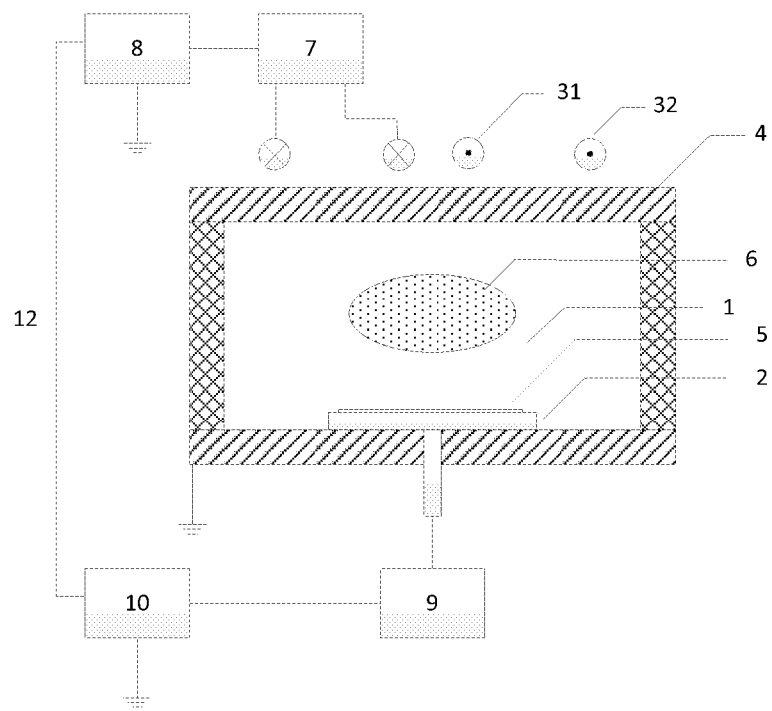
FIG. 1 is a schematic structural diagram of a pulsing inductively coupled plasma system according to some embodiments of the present disclosure.

FIG. 1 shows a plasma device of pulsing inductively coupled plasma for the etching process applied on a large dimension wafer (a diameter larger than or equal to 300 nm). The plasma device of the pulsing inductively coupled plasma includes a reaction chamber 1, an electrostatic chuck 2 located in the reaction chamber 1, a medium window 4 at a top of the reaction chamber 1, and an inductively coupled coil arranged at a top of the medium window 4. The inductively coupled coil includes an inner coil 31 and an outer coil 32. The electrostatic chuck 2 is electrically connected to a lower matching device 9 and a lower RF power supply 10. A wafer 5 is installed on the electrostatic chuck 2. An upper RF power supply 8 outputs the energy to the inner coil 31 and the outer coil 32 by an upper matching device 8 including a current distribution function. The upper RF power supply 8 and the lower RF power supply 10 include a power supply device, which can generate a pulsing RF signal. A pulsing synchronization line 12 (e.g., pulse signal phase difference control line) connects between the two power supplies. The entire system generates a pulsing plasma 6 by loading the pulsing RF signal into the chamber to act on the wafer 5 to implement the etching process.

Figure 2:
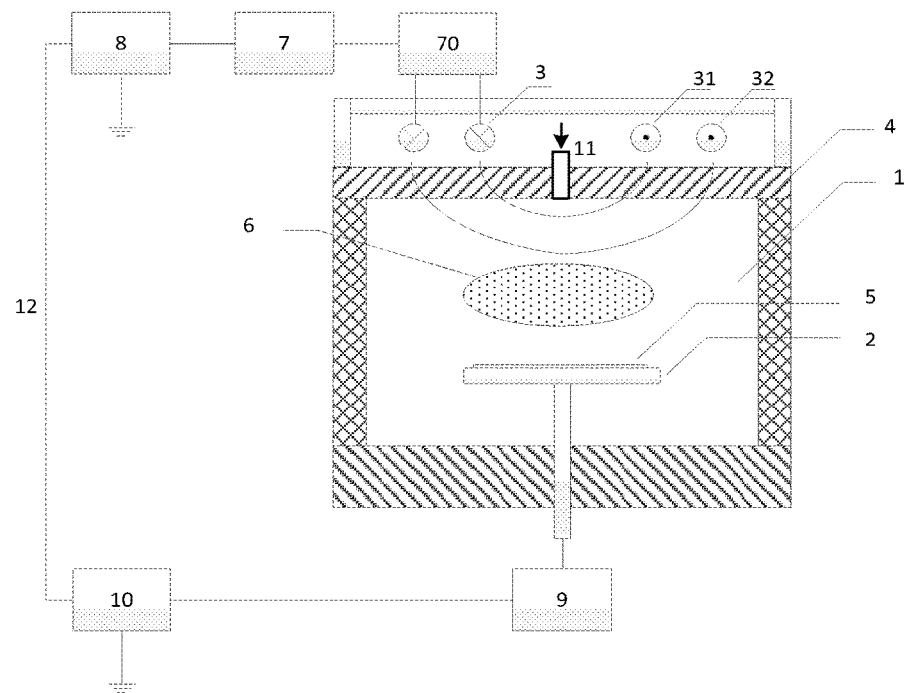
FIG. 2 is a schematic structural diagram of a double-coil inductively coupled plasma system according to some embodiments of the present disclosure.
Figure 3:
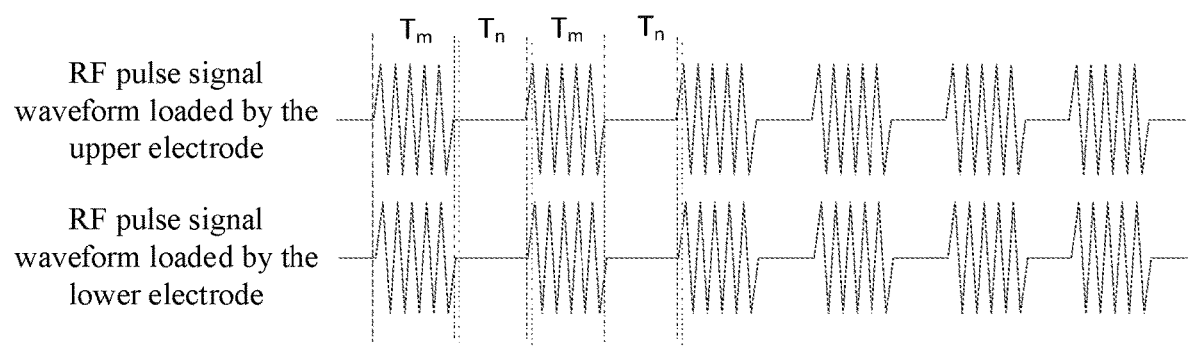
FIG. 3 is a schematic pulse time sequence diagram of the double-coil inductively coupled plasma device shown in FIG. 2.

FIG. 2 shows double-coil inductively coupled plasma equipment. Different from FIG. 1, the upper RF power supply 8 outputs the energy to the inner coil 31 and the outer coil 32 through the upper matching device 7 and then by being connected to a current distribution circuit 70. The RF energy can ionize the gas input by a nozzle 11 to generate the plasma 6 to act on the wafer 5 for performing the process. The upper RF power supply 8 and the lower RF power supply 10 are pulsing RF power supplies, which output the pulsing RF signals. The pulsing synchronization line 12 connects between the two power supplies. The equipment uses the pulse technology to output the RF energy to the chamber to reduce the plasma damage and improve the process performance. A pulse application manner is that an upper electrode system (including the upper RF power supply 8, the upper matching device 7, and the current distribution circuit 70) uses the pulsing RF energy, and meanwhile, a lower electrode system (including the lower RF power supply 10 and the lower matching device 9) uses the pulsing RF energy. Frequencies of the RF energy loaded by the upper electrode system and the lower electrode system are the same. The phases of the RF waveforms are synchronized. Pulse frequencies and duty cycles of the RF energy are also the same. Through the synchronized pulses of the upper and lower electrodes, particle speed and temperature of the plasma are greatly reduced to greatly reduce the particle energy that bombards the wafer 5. As shown in FIG. 3, a time length of pulse on a loading signal is Tm. A time length of pulse off of the loading signal is Tn. The pulse frequency is f=1/(Tm+Tn), and the duty cycle of the pulse is D=Tm/(Tm+Tn).

Figure 4:
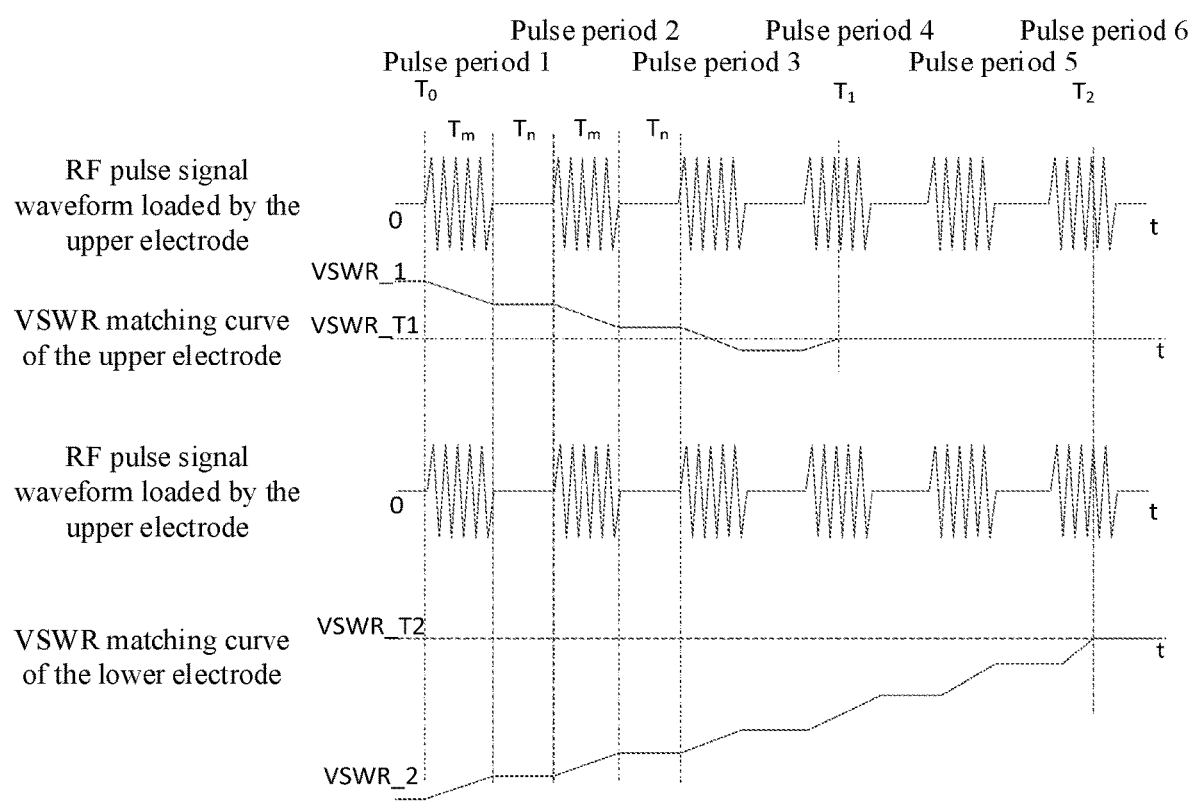
FIG. 4 is a schematic pulse signal waveform and a voltage standing wave ratio (VSWR) time sequence map of pulsing synchronize in FIG. 2.
Figure 5:
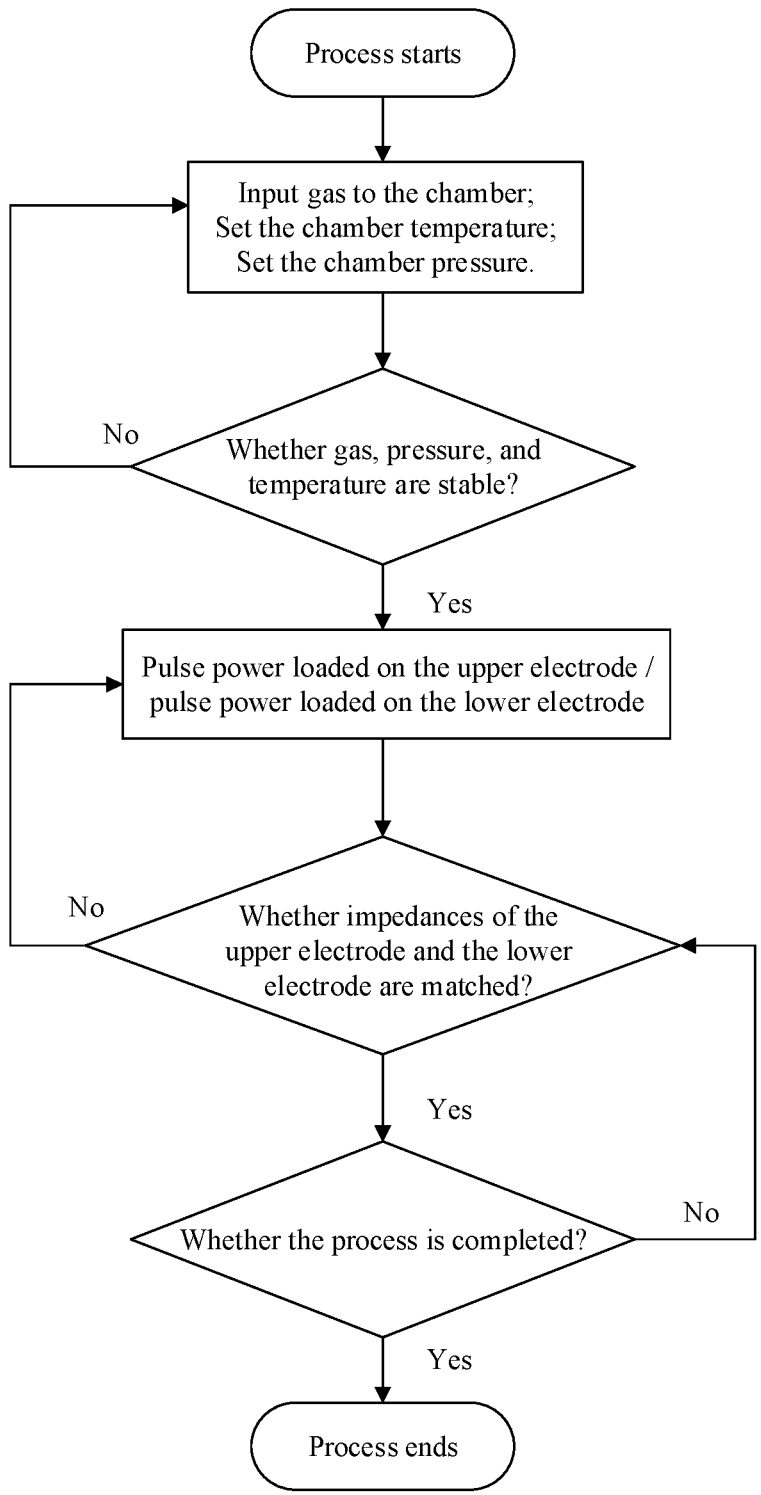
FIG. 5 is a schematic process flowchart of the pulsing synchronize in FIG. 2.

A process flow of applying with pulsing synchronize matching is shown in FIG. 5. The pulse signal of the upper electrode and the pulse signal of the lower electrode are loaded into the chamber simultaneously. Since coupling exists between the pulse signals of the upper electrode and the lower electrode, mutual interference causes an impedance of the upper electrode and an impedance of the lower electrode are in a fluctuating state. The impedance of the plasma is not stabilized until after the upper electrode and the lower electrode realize ignition matching. As shown in FIG. 4, in the pulse matching of the plasma device, the upper electrode system and the lower electrode system load the RF pulse signals simultaneously to excite the plasma. However, the time of power loading in a pulse mode is short, thus, the plasma is difficult to ignite. Moreover, when the upper electrode and the lower electrode are matched simultaneously, the plasma changes with two matching systems, the fluctuation is large, and the matching time is long. The plasma of the chamber plasma in the pulse mode is not stable, and the impedance fluctuation causes an unmatching phenomenon to cause a small process application window of the equipment.

Embodiments of the present disclosure provide an RF pulse matching method, which is used to control an upper matching device and a lower matching device to match pulse time sequences of an upper RF power supply and a lower RF power supply, respectively. By controlling the time sequences of the matching devices of an upper electrode and a lower electrode, a purpose may be achieved to reduce impedance fluctuation, reduce mutual interferences between the two matching devices, improve a pulse matching speed, effectively prevent unmatching, and enhance stability of a plasma.

In the RF pulse matching method and the RF pulse device of embodiments of the present disclosure, to prevent the mutual interferences of the pulse matching between the two electrodes, a technical concept may follow the following rules.

1) After the upper electrode realizes the pulse matching, and the stable plasma is generated, the pulse matching of the lower electrode may start. If the upper electrode is not matched, the plasma is unstable, the impedance of the lower electrode may be greatly impacted, and the ignition and the matching may be difficult to realize.

2) After the upper electrode is matched, the plasma may achieve a stable state. At this point, the ignition of the lower electrode may still affect the impedance of the upper electrode to cause the fluctuation. Therefore, the upper matching device continues matching, and meanwhile, the lower device is also matching, both of which may bring a continuous fluctuation of the impedance. Since the fluctuation may be overlayed, the matching time is longer than individual matching time. By arranging the pulse matching time sequence control line between the two matching devices, real-time communication and alternative matching control between the two matching devices may be realized.

Figure 6:
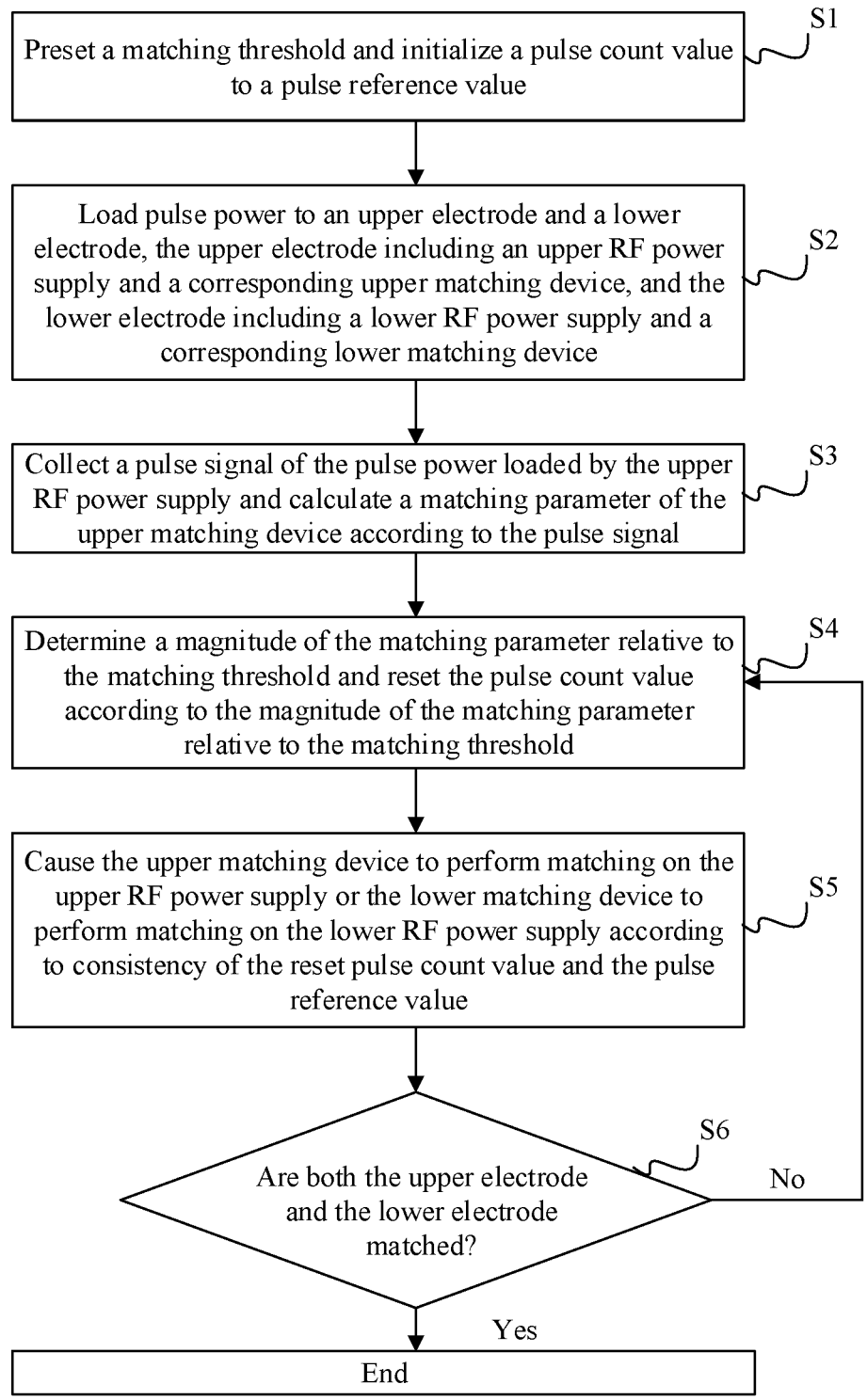
FIG. 6 is a schematic flowchart of a radio frequency (RF) pulse matching method according to some embodiments of the present disclosure.

As shown in FIG. 6, in the present disclosure, during a process of controlling the time sequences of the upper matching device and the lower matching device to perform a staggered pulse matching action, the RF pulse matching method includes the following processes:

at S1, presetting a matching threshold and initializing a pulse count value to a pulse reference value;

at S2, loading pulse power to an upper electrode and a lower electrode, the upper electrode including an upper RF power supply and a corresponding upper matching device, and the lower electrode including a lower RF power supply and a corresponding lower matching device;

at S3, collecting a pulse signal of the pulse power loaded by the upper RF power supply and calculating a matching parameter of the matching device according to the pulse signal;

at S4, determining a magnitude of the matching parameter relative to the matching threshold and re-configuring the pulse count value according to the magnitude of the matching parameter relative to the matching threshold;

at S5, causing any one of the upper matching device to perform matching on the upper RF power supply or the lower matching device to perform matching on the lower RF power supply according to consistency of the reconfigured pulse count value and the pulse reference value; and at S6, repeating process S4 and process S5 until the upper RF power supply and the lower RF power supply are matched.

The upper matching device and the lower matching device are controlled in a time sequence to perform staggered pulse matching. That is, the upper matching device and the lower matching device do not perform the pulse matching action simultaneously. For example, when the matching is performed on the upper electrode, the lower electrode maintains a previous state. On the contrary, when the matching is performed on the lower electrode, the upper electrode maintains a previous state. As such, mutual coupled signals may be prevented from affecting impedance fluctuation of plasma to affect the matching time.

At process S4, on a rising edge of each pulse period of the upper RF power supply, a determination may be performed once on the magnitude of the matching parameter relative to the matching threshold, and the pulse count value may be reset to be maintained consistently or change to a different value according to a determination result. The consistency may refer to a same value, a same parity of the value, or other properties, which are exemplary but not limited. For example, the pulse count value may be reset to be maintained the same or be added by one according to the determination result, or the pulse count value may be reset to maintain the same parity or change to an opposite parity according to the determination result.

During matching, the key processes implemented include the following processes.

At process S1, the pulse reference value is a first constant.

At process S4, if the matching parameter is greater than the matching threshold, the pulse count value may be reset to the first constant or a value having the same parity as the first constant. If the matching parameter is less than the matching threshold, the pulse count value may be reset to a second constant. The second constant is not equal to the first constant or has a different parity from the first constant.

At process S5, if the pulse count value is equal to the pulse reference value or has the same parity with the pulse reference value, the upper matching device performs matching on the upper RF power supply. If the pulse count value is not equal to the pulse reference value or has a different parity from the pulse reference value, the lower matching device performs matching on the lower RF power supply.

Two simple examples are described as follows.

First, the pulse reference value may be initialized to zero.

After the matching parameter is calculated and obtained, if the matching parameter is greater than the matching threshold, the pulse count value may maintain unchanged. If the matching parameter is less than the matching threshold, the pulse count value may be added by one.

Then, according to the pulse count value, if the pulse count value and the pulse reference value both are an even number, the upper matching device may perform matching on the upper RF power supply. If the pulse count value and the pulse reference value both are an odd number, the lower matching device may perform matching on the lower RF power supply.

Or, first, the pulse reference value is initialized to zero.

After the matching parameter is calculated, if the matching parameter is greater than the matching threshold, the pulse count value may maintain unchanged. If the matching parameter is less than the matching threshold, the pulse count value may be cyclically added by one or subtracted by one in sequence on the rising edge of each pulse period of the upper RF power supply.

Then, according to the pulse count value, if the pulse count value and the pulse reference value both are zero, the upper matching device may perform matching on the upper RF power supply. If the pulse count value and the pulse reference value both are one, the lower matching device may perform matching on the lower RF power supply.

The matching threshold may include any one of a voltage standing wave ratio (VSWR) threshold, a reflection coefficient threshold, and an impedance threshold of the upper matching device. Correspondingly, the matching parameter may include any one of a VSWR, a reflection coefficient, and an impedance of the upper matching device. That is, working levels of the upper matching device and the lower matching device are restricted by any one of the VSWR threshold (or reflection coefficient $\Gamma$, impedance Z, etc.) and the pulse count value i. Here, the VSWR threshold VSWR, the reflection coefficient threshold $\Gamma$, and the impedance threshold ZL may be converted and calculated by formulas (1) and (2).

$$VSWR=(1+|\Gamma|)/(1-|\Gamma|) \quad (1)$$

$$\Gamma=(ZL-Z0)/(ZL+Z0) \quad (2)$$

where Z0 denotes a feature impedance and usually is 50Ω.

Generally, the matching threshold of the VSWR may range from 1 to 10. In some embodiments, the matching threshold of the VSWR may include any integers that range from 1 to 10. The reflection coefficient threshold F and the impedance threshold ZL may be calculated by formulas (1) and (2).

Figure 7:
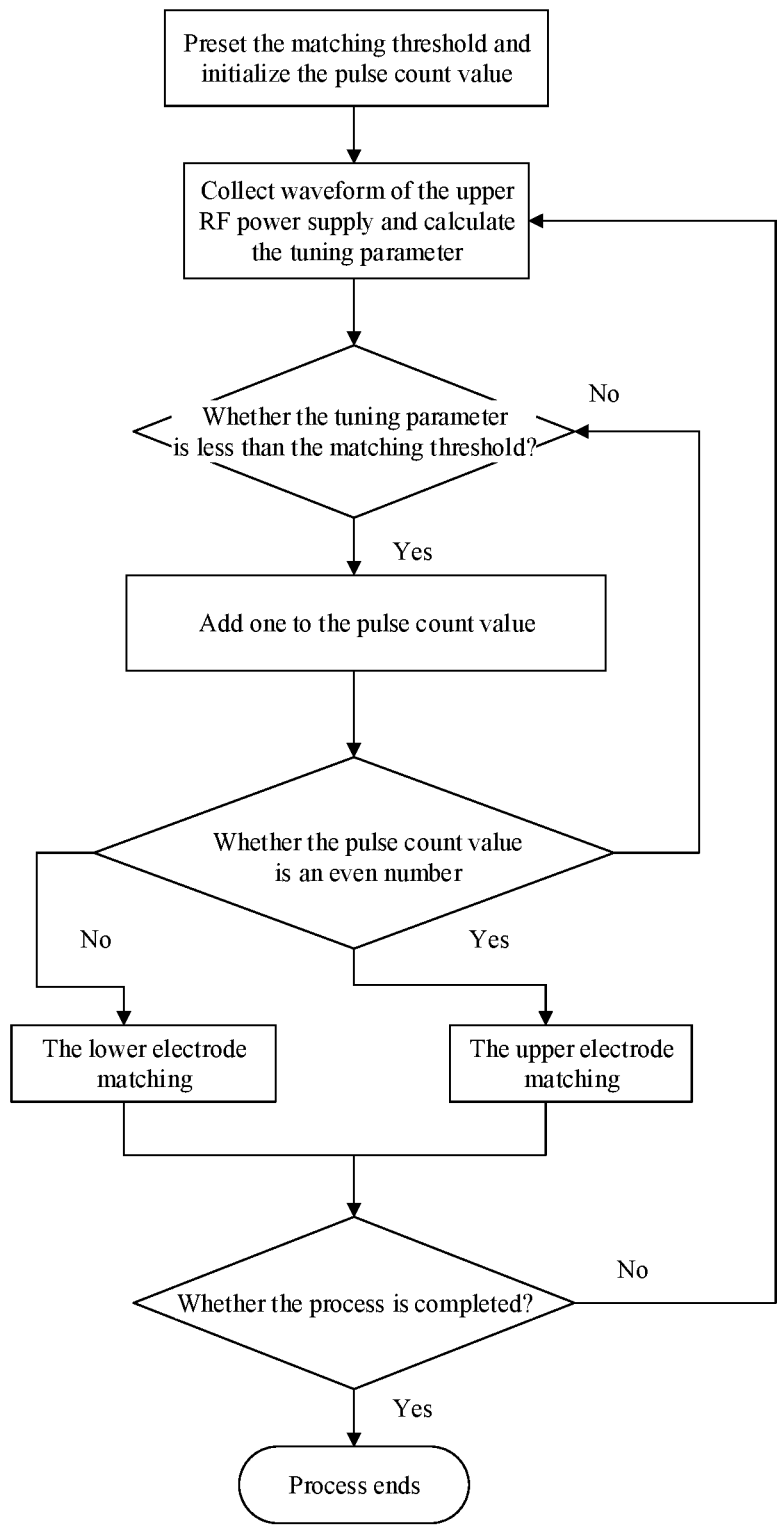
FIG. 7 is a schematic process flowchart of pulse matching according to some embodiments of the present disclosure.

During the pulsing synchronize matching of the upper electrode and the lower electrode, the two matching devices may be controlled by the working level. The working level may be realized by an independent algorithm program inside the matching device. The VSWR as the matching parameter is taken as an example. Referring to FIG. 7, a specific process flow of the RF pulse matching method of embodiments of the present disclosure is as follows.

After sensing the pulse signal, the upper matching device starts matching to determine the relationship between the voltage standing wave ratio VSWR_1 and the matching threshold VSWR_0 (e.g., generally from 1 to 10, which represents an ignition state of the plasma, and the impedance is stable).

Case 1: if VSWR_1 is greater than the threshold VSWR_0, the working level of the upper matching device may be high-level 1, the upper matching device may perform matching, and the pulse count value i may maintain unchanged, i=0. The pulse count value i may need to be determined once on the rising edge of each pulse period of the upper RF power supply whether to maintain unchanged or be added by one. Meanwhile, the working level of the lower matching device is low-level 0, and the lower matching device may maintain the current state and may not perform matching.

Case 2: if VSWR_1 is less than the threshold VSWR_0, the pulse count value i may be added by one or cyclically added by one, or subtracted by one on the rising edge of each pulse period. When the pulse count value i is an even number (including 0), the working level of the upper electrode device may be high-level 1, and the upper matching device may perform matching. However, the working level of the lower matching device is low-level 0, and the lower matching device may maintain the previous state unchanged. When the pulse count value i is an odd number, the working level of the upper matching device may be low-level 0, and the upper matching device may maintain the previous state unchanged. However, the working level of the lower matching device may be high-level 1, and the lower matching device may perform matching. Since the plasma may not be affected by the impedance fluctuation caused by another electrode matching device during each matching, and only the matching device, whose working level is high-level, performs impedance matching, thus the matching speed is fast.

Figure 8:
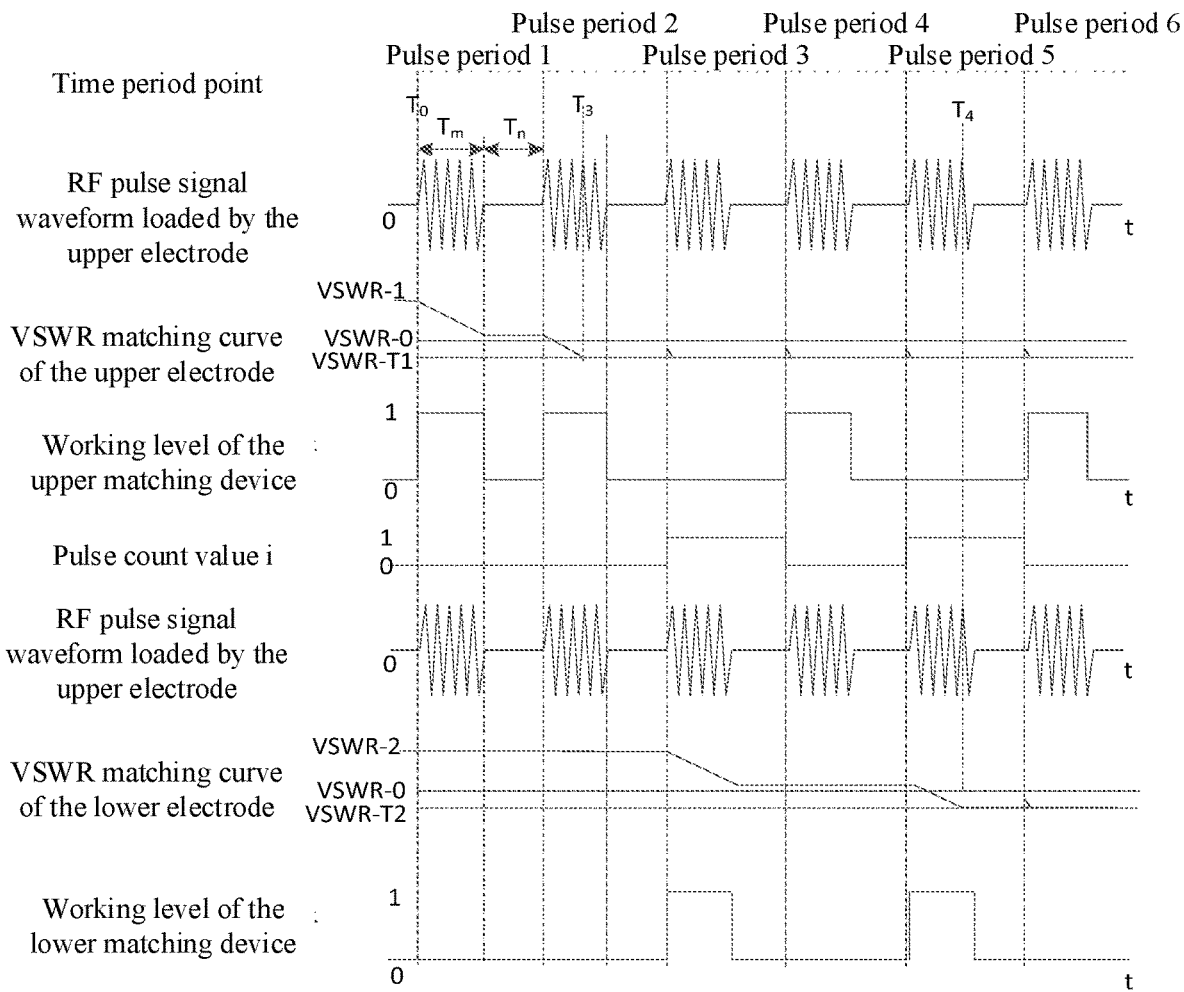
FIG. 8 is a schematic time sequence diagram of the pulse matching according to some embodiments of the present disclosure.

The pulse count value i is initialized to zero, and the matching time sequence map shown in FIG. 8 is described as follows.

1) Start from time 0, the upper electrode loads the pulse power, and the lower electrode loads the pulse power.

2) In pulse period 1, after sensing the pulse signal, the upper matching device determines that VSWR_1 of the upper electrode is greater than the threshold VSWR_0. Therefore, the pulse count value i=0, and the pulse count value and the pulse reference value have the same parity. At this point, the working level of the upper matching device is high-level 1. Thus, the upper matching device performs matching, and the VSWR of the upper electrode continues to approach a matching point VSWR_T1 from VSWR_1. Meanwhile, in pulse period 1, the working level of the lower matching device is low-level 0, thus, the lower matching device maintains the previous state unchanged.

3) In pulse period 2, the upper matching device determines that VSWR_1 is greater than the threshold VSWR_0, the pulse count value maintains unchanged, i=0, and the pulse count value and the pulse reference value have the same parity. At this point, the working level of the upper matching device is high-level 1, the upper matching device continues to perform matching. At time T3, the matching is achieved (e.g., VSWR_1=VSWR_T1). Meanwhile, the working level of the lower matching device is low-level 0, thus, the lower matching device maintains the previous state unchanged.

4) In pulse period 3, the upper matching device determines that VSWR_1 is less than the threshold VSWR_0, the pulse count value i=1, and the pulse count value and the pulse reference value have different parity, thus, the working level of the upper matching device is 0, the upper matching device does not perform matching and maintains the previous state unchanged. Meanwhile, since the pulse count value i=1, the working level of the lower matching device is high-level 1, the lower matching device performs matching to cause VSWR_2 to approach VSWR_T2.

5) In pulse period 4, the upper matching device determines that the VSWR_1 is less than or equal to the threshold VSWR_0, the pulse count value i=2, and the pulse count value and the pulse reference value have the same parity. At this point, the working level of the upper matching device is 1, and the upper matching device performs matching. Meanwhile, since the pulse count value i=2, and the working level of the lower matching device is low-level 0, the lower matching device does not perform matching and maintains the previous state unchanged.

6) In pulse period 5, the upper matching device determines that the VSWR_1 is less than or equal to the threshold VSWR_0, the pulse count value i=3, and the pulse count value and the pulse reference value have a different parity. At this point, the working level of the upper matching device is 0, and the upper matching device does not perform matching and maintains the previous state unchanged. Meanwhile, since the pulse count value i=3, and the working level of the lower matching device is high-level 1, the lower matching device performs the matching, and the impedance matching is achieved at time T4 (e.g., VSWR_2=VSWR_T2).

7) As such, the matching devices continue to determine and perform matching in subsequent pulse periods to maintain the impedance stable until the process is completed and the matching is over.

Figure 9:
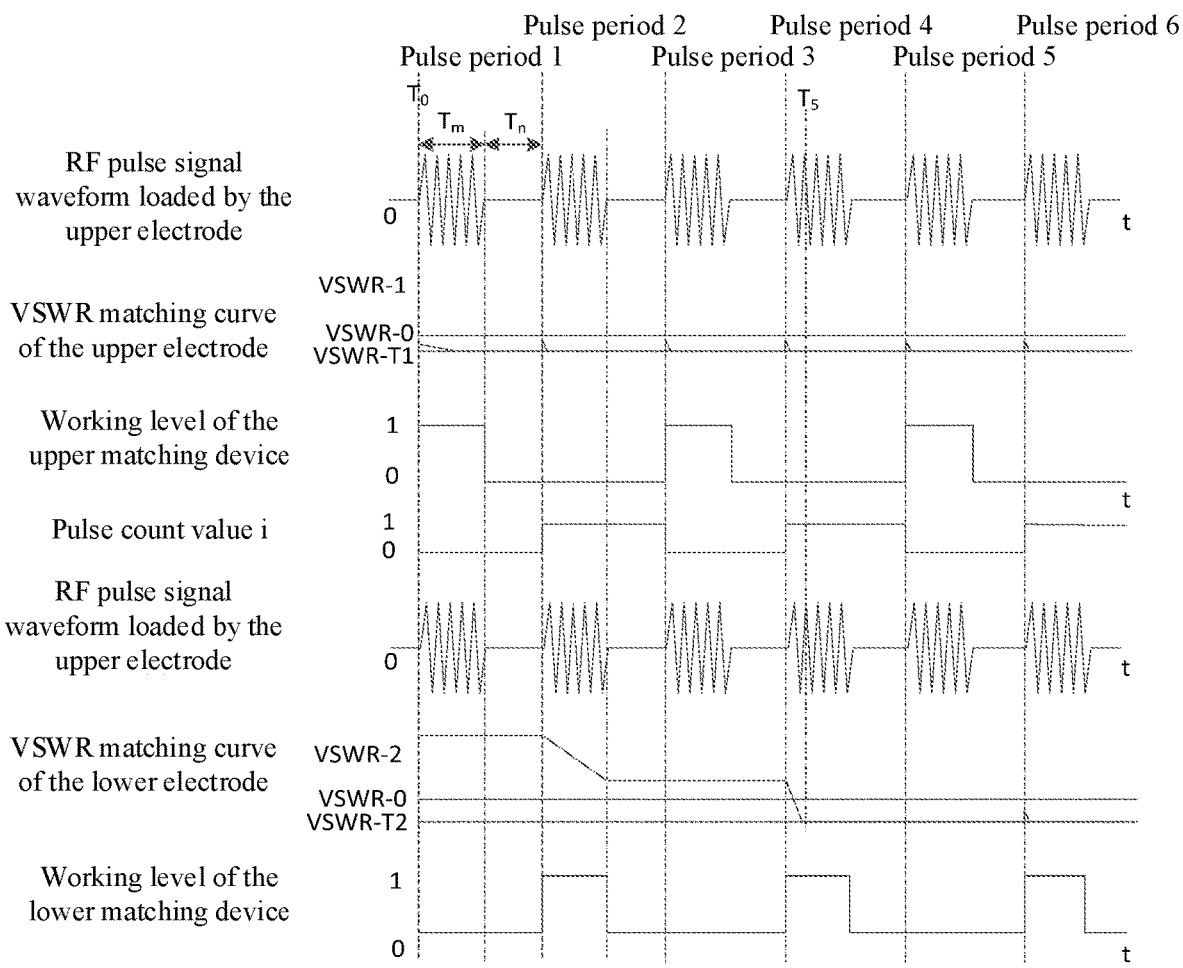
FIG. 9 is another schematic time sequence diagram of the pulse matching according to some embodiments of the present disclosure.

For another example, the pulse count value is also initialized to zero, and the matching time sequence map shown in FIG. 9 is described as follows.

1) Starting from time 0, the upper electrode loads the pulse power, and the lower electrode loads the pulse power.

2) In pulse period 1, after sensing the pulse signal, the upper matching device determines that the VSWT_1 of the upper electrode impedance is less than the threshold VSWR_0, the pulse count value i=0, and the pulse count value is equal to the pulse reference value. At this point, the working level of the upper matching device is high-level 1. Thus, the upper matching device performs matching, and the VSWR_1 of the impedance of the upper electrode continues to approach the matching point VSWR_T1. Meanwhile, the working level of the lower matching device is low-level 0, and the lower matching device does not perform matching and maintains the previous state unchanged.

3) In pulse period 2, the upper matching device determines that the VSWR_1 is less than the threshold VSWR_0, the pulse count value i=1, and the pulse count value is not equal to the pulse reference value. At this point, the working level of the upper matching device is low-level 0, the upper matching device maintains the previous state unchanged. Meanwhile, the working level of the lower matching device is high-level 1. Therefore, the lower matching device performs matching to cause the VSWR_2 to approach VSWR_T2.

4) In pulse period 3, the upper matching device determines that the VSWR_1 is less than the threshold VSWR_0, the pulse count value i=0, and the pulse count value is equal to the pulse reference value. At this point, the working level of the upper matching device is 1, the upper matching device performs matching. Meanwhile, since the pulse count value i=2, the working level of the lower matching device is low-level 0, the lower matching device does not perform matching and maintains the previous state unchanged.

5) In pulse period 4, the upper matching device determines that VSWR_1 is less than the threshold VSWR_0, the pulse count value i=1, and the pulse count value is not equal to the pulse reference value. At this point, the working level of the upper matching device is 0, the upper matching device does not perform matching and maintains the previous state unchanged. Meanwhile, since the pulse count value i=3, and the working level of the lower matching device is high-level 1, the lower matching device performs matching, and the impedance is matched at time T5 (e.g., VSWR_2=VSWR_T2).

6) As such, the matching devices continue to determine and perform matching in the subsequent pulse periods to maintain the impedance stable until the process is completed to end matching.

In contrast, in the existing technology of FIG. 4, the synchronized pulse signals loaded by the upper electrode and the lower electrode are signals with the same frequency and duty cycle. At time 0, a synchronization trigger starts, the upper matching device performs pulse matching during a time period of high-level of the pulse power loaded by the upper electrode. The VSWR_1 of the impedance of the upper electrode continues to approach the target value VSWR_T1. The matching is achieved at time T1 after several pulse periods. Meanwhile, the lower matching device also performs pulse matching during the time period of high-level of the pulse power loaded by the lower electrode. After the upper electrode realizes the impedance matching, the plasma stabilizes. The VSWR_2 of the impedance of the lower electrode also continues to approach a target value VSWR_T2, and the matching is achieved at time T2 after several pulse periods. After the pulse matching time sequence control manner is used in embodiments of the present disclosure, the two matching devices may achieve precise control to achieve matching at time T4 (or T5). The matching time T4 is shorter than or equal to the matching time T2 of the existing technology, and the matching speed is greatly improved.

In some embodiments, the RF signal frequencies of the pulse power loaded by the upper electrode and the lower electrode may be the same, the pulse signal frequencies may be the same, and the pulse signal duty cycles may be the same. For example, the pulse frequency may be 100 Hz or other pulse frequencies. The duty cycle may be 50% or other duty cycles. An RF frequency loaded by the electrode is not limited to 13.56 MHz but also may include high frequencies of 400 kHz, 2 MHz, 27 MHz, 40 MHz, 60 MHz, 100 MHz, etc. More than two frequency signals may be loaded, such as 2 MHz and 13.56 MHz.

Correspondingly, embodiments of the present disclosure further provide an RF pulse device and a pulsing plasma generation system including the RF pulse device. The RF pulse device may include the upper electrode and the lower electrode. The upper electrode may include the RF power supply and the corresponding upper matching device. The lower electrode may include the lower RF power supply and the corresponding lower matching device. The pulsing synchronization line may connect between the upper RF power supply and the lower RF power supply. The pulse matching time sequence control line and the time sequence matching circuit may be arranged between the upper matching device and the lower matching device to achieve precise time sequence control of the matching. The time sequence matching circuit may be implemented by the program manner arranged in the upper matching device.

Figure 10:
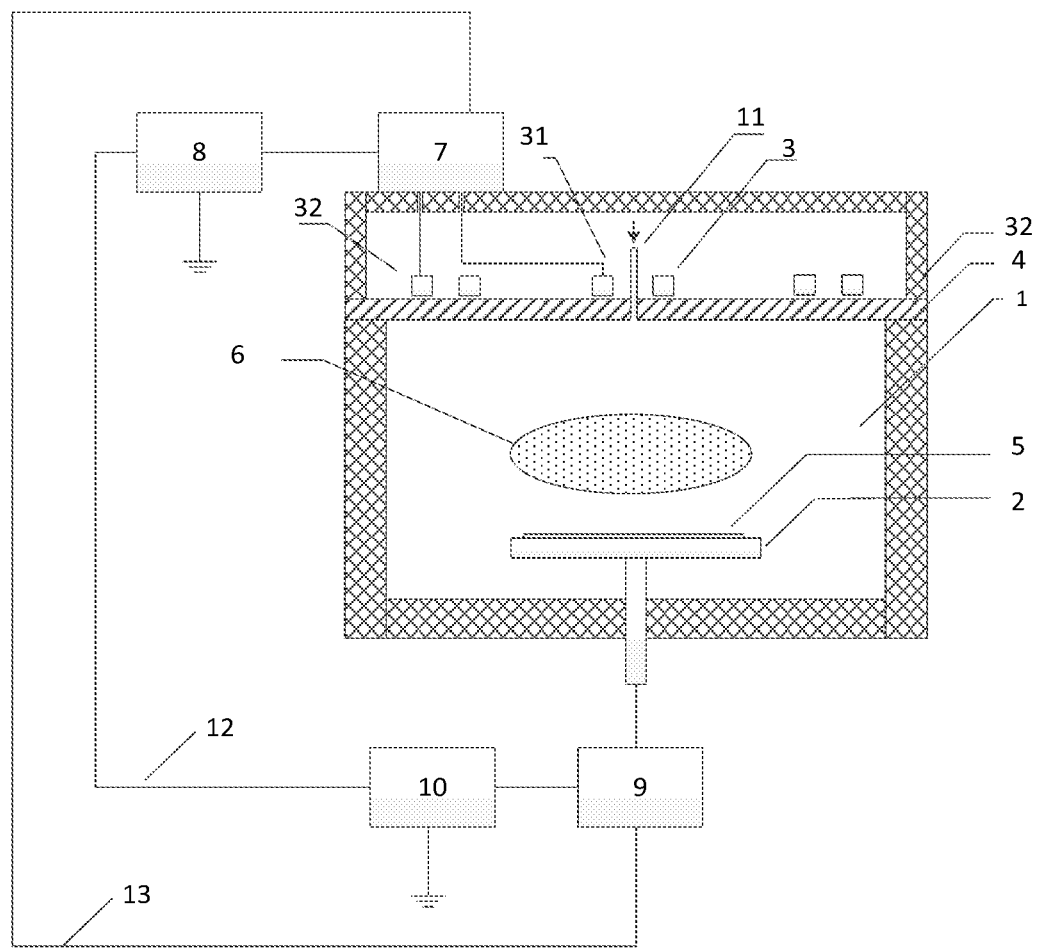
FIG. 10 is a schematic structural diagram of a pulse plasma generation system according to some embodiments of the present disclosure.

FIG. 10 is a schematic structural diagram of a pulsing plasma generation system according to some embodiments of the present disclosure. As shown in FIG. 10, in a plasma chamber, an electrostatic chuck 2 is located at a lower part of a reaction chamber 1. A medium window 4 (e.g., a ceramic material or a quartz material) is located at an upper part of the reaction chamber 1. A gas channel nozzle 11 is arranged at the center of the medium window 4. The gas (e.g., Ar, He, $N_2$, $H_2$, $O_2$, $Cl_2$, HBr, $BCl_3$, $C_4F_8$, $CF_4$, $SF_6$, etc.) may be guided into the chamber through the nozzle 11. RF energy ionizes the gas input from the nozzle 11 to generate plasma 6 to act on wafer 5 to perform the process. The inductively coupled coil 3 includes two sub-coils of an outer coil 32 and an inner coil 31. The two sub-coils may include a planar structure on the medium window 4 perpendicular to the center axis. The upper electrode RF system includes the RF power supply connecting an upper matching device 7 having the current distribution function and then being connected to the inductively coupled coil 3, which can output the energy to the inner coil 31 and the outer coil 32. The lower electrode includes the RF power supply being connected to the lower matching device 9 and then being connected to the electrostatic chuck 2 to achieve feedback of the RF power of the lower electrode. The wafer 5 is placed right above the electrostatic chuck 2. The upper RF power supply 8 and the lower RF power supply 10 are connected to a pulsing synchronization line 12 to be used as pulse phase difference synchronize control. Meanwhile, a pulse matching control line 13 connects between the upper matching device 7 and the lower matching device 9 as a pulse matching time sequence control between the two matching devices. A magnetic field formed by the upper and lower electrodes in the chamber ionizes the special gas passing through the nozzle 11 to generate the plasma 6 to act on the wafer 5 to implement the process.

Figure 11:
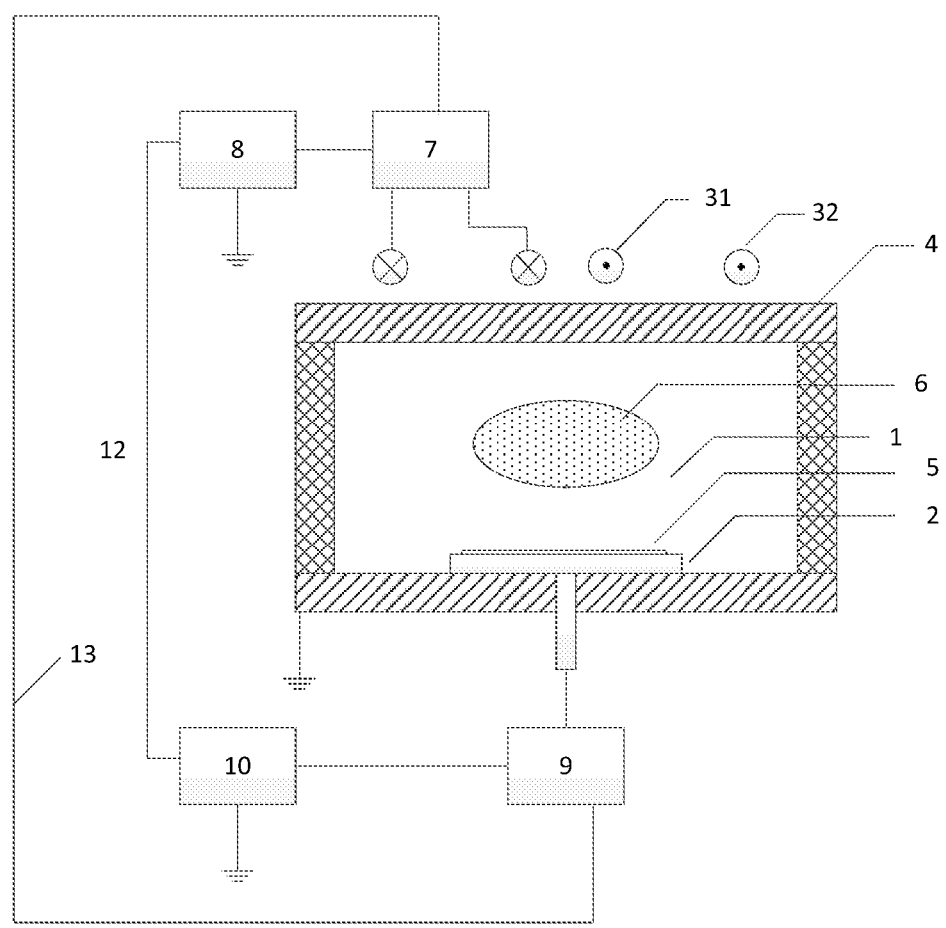
FIG. 11 is a schematic structural diagram of another pulse plasma generation system according to some embodiments of the present disclosure.

Of course, the pulse plasma generation system may also include a structure without the nozzle. As shown in FIG. 11, the equipment includes a reaction chamber 1, an electrostatic chuck 2, and an inductively coupled coil 3. The inductively coupled coil 3 includes an inner coil 31 and an outer coil 32, which are located above a medium window 4. The electrostatic chuck 2 is located inside the reaction chamber 1 and is connected to the lower matching device 9 and the lower RF power supply 10. A wafer 5 is installed on the electrostatic chuck 2. The upper RF power supply 8 outputs energy to the inner coil 31 and the outer coil 32 by a dual output matching device having the current distribution function. The upper RF power supply 8 and the lower RF power supply 10 include a power supply device, which may generate the pulse RF signal. A pulsing synchronization line 12 connects between the two power supplies. A pulse matching control line 13 connects between the two matching devices. The whole system may achieve the etching process by loading the pulse RF signal into the chamber to generate the pulse plasma 6 to act on the wafer 5.

Figure 12:
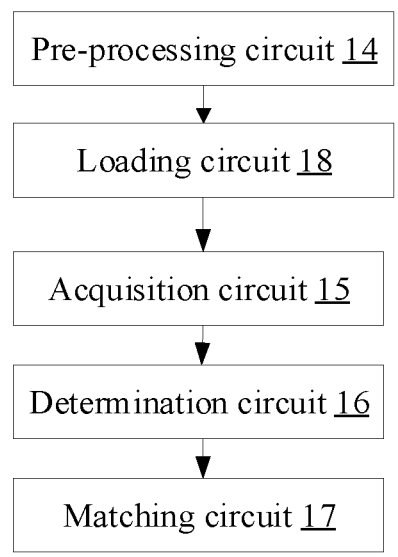
FIG. 12 is a schematic structural diagram of an RF pulse device according to some embodiments of the present disclosure.

The pulsing plasma generation systems in FIG. 10 and FIG. 11 both use the RF pulse device. As shown in FIG. 12, the time sequence matching circuit in the RF pulse device includes a pre-processing circuit 14, an acquisition circuit 15, a determination circuit 16, a matching circuit 17, and a loading circuit 18. A specific structure of the RF pulse device includes: the pre-processing circuit 14, configured to preset a matching threshold and initialize the pulse count value to the pulse reference value;

the loading circuit 18, configured to load the pulse power to the upper electrode and the lower electrode;

the acquisition circuit 15, configured to collect the pulse signal of the pulse power loaded by the upper RF power supply and calculate the matching parameter of the upper matching device according to the pulse signal;

the determination circuit 16, configured to determine the magnitude of the matching parameter relative to the matching threshold and reset the pulse count value according to the magnitude of the matching parameter relative to the matching threshold; and the Matching circuit 17, configured to cause the upper matching device to perform matching on the upper RF power supply or the lower matching device to perform matching on the lower RF power supply according to the consistency of the reset pulse count value and the pulse reference value.

With further refinement:

the pre-processing circuit 14 may initialize the pulse reference value to the first constant; if the determination circuit 16 determines that the matching parameter is greater than the matching threshold, the determination circuit 16 may reset the pulse count value to the first constant or a value having the same parity with the first constant; if the matching parameter is less than or equal to the matching threshold, the determination circuit 16 may reset the pulse count value as a second constant. The second constant may be not equal to the first constant or has a different parity with the first constant; and if the pulse count value is equal to the pulse reference value or has the same parity as the pulse reference value, the Matching circuit 17 may cause the upper matching device to perform matching on the upper RF power supply; if the pulse count value is not equal to the pulse reference value or has different parity from the pulse reference value, the Matching circuit 17 may cause the lower matching device to perform matching on the RF power supply.

In the pre-processing circuit 14, the matching threshold may include any one of a VSWR threshold, a reflection coefficient threshold, and an impedance threshold of the upper matching device 7. In the acquisition circuit 15, the matching parameter may include any one of a VSWR, a reflection coefficient, and an impedance of the corresponding upper matching device 7. In some embodiments, the matching threshold of the VSWR may range from 1 to 10. In some embodiments, the matching threshold of the VSWR may include any one of integers ranging from 1 to 10. The reflection coefficient threshold F and the impedance threshold ZL may be calculated according to the formulas (1) and (2), which are not repeated here.

Corresponding to the RF pulse matching method, in the RF pulse device, the RF signal frequencies of the pulse power loaded by the upper electrode and the lower electrode may be the same, the pulse signal frequencies may be the same, and the pulse signal duty cycles may be the same.

In connection with a part of the description of the RF pulse matching method, in the application of the pulse plasma of the existing technology, when the upper electrode and the lower electrode load the pulse signals simultaneously, the simultaneous operation of the upper matching device and the lower matching device may cause the impedance to continuously fluctuate. Since the impedance is affected by the simultaneous operation of the two matching devices, the fluctuation of the plasma impedance may be large, the matching time of the upper matching device and the lower matching device may be long, and the matching may be achieved at time T2. In the RF pulse device of embodiments of the present disclosure, by adding the pulse matching time sequence control line between the two matching devices to precisely control actions of the two matching devices. The actions of the upper matching device and the lower matching device may be performed individually. Since no impact is from the matching of the other electrode, the mutual interference between the two matching devices may be reduced, the matching speed may be fast, the unmatching may be prevented, and the stability of the process may be enhanced. In addition, since the matching time is fast, the matching stability is good, and the plasma stability is high, the risk of the unmatching of the matching device may be greatly reduced, which is beneficial to enlarge the hardware window and for the stability of the process.

In summary, the RF pulse matching method of the present disclosure and the RF pulse matching device have two major beneficial effects as follows:

1. the matching time of the pulsing plasma is fast; and
2. the pulsing plasma is less affected by the two electrodes, the fluctuation is small, thus the stability is high.

The RF pulse matching method and the RF pulse matching device of the present disclosure also include other derived examples, for example, including that the upper electrode of the plasma system may include a structure of multi-planes or a three-dimensional coil group. Meanwhile, the suitable application platform of the pulsing plasma generation device is not limited. The pulse plasma generation device may be applied in ICP equipment, capacitively coupled plasma (CCP) equipment, and other equipment.

The above embodiments are merely exemplary embodiments used to illustrate the principle of the present disclosure, but the present disclosure is not limited to this. For those of ordinary skill in the art, various modifications and improvements can be made without departing from the spirit and essence of the present disclosure, and these modifications and improvements are also within the scope of the present disclosure.

What is claimed is:

1. A radio frequency (RF) pulse matching method, comprising:
    presetting a matching threshold and initializing a pulse count value to a pulse reference value;
    loading pulse power to an upper electrode and a lower electrode, the upper electrode including an upper RF power supply and a corresponding upper matching device, and the lower electrode including a lower RF power supply and a corresponding lower matching device;
    collecting a pulse signal of the pulse power loaded by the upper RF power supply and calculating a matching parameter of the upper matching device according to the pulse signal;
    determining a magnitude of the matching parameter relative to the matching threshold and resetting the pulse count value;
    causing of the upper matching device to perform matching on the upper RF power supply or the lower matching device to perform matching on the lower RF power supply according to consistency of the reset pulse count value and the pulse reference value; and
    repeating processes until the upper RF power supply and the lower RF power supply are matched.

2. The method according to claim 1, wherein determining the magnitude of the matching parameter relative to the matching threshold and resetting the pulse count value includes:
    on a rising edge of each pulse period of the upper RF power supply:
        performing a determination on the magnitude of the matching parameter relative to the magnitude of the matching threshold; and
        resetting the pulse count value to be maintained the same or change to a different value according to a determination result.

3. The method according to claim 1, wherein:
    the pulse reference value is a first constant;
    in response to the matching parameter being greater than the matching threshold, the pulse count value is reset to the first constant or a value having a same parity as the first constant;
    in response to the matching parameter being less than the matching threshold, the pulse count value is reset to a second constant, the second constant being not equal to the first constant or having a different parity from the first constant;
    in response to the pulse count value being equal to the pulse reference value or having a same parity as the pulse reference value, the upper matching device performs matching on the upper RF power supply; and
    in response to the pulse count value being not equal to the pulse reference value or having a different parity from the pulse reference value, the lower matching device performs matching on the lower RF power supply.

4. The method according to claim 1, wherein:
    the matching threshold includes any one of a voltage standing wave ratio (VSWR) threshold, a reflection coefficient threshold, or an impedance threshold; and
    the matching parameter includes any one of a VSWR, a reflection coefficient, or an impedance of the corresponding upper matching device.

5. The method according to claim 4, wherein when the matching threshold is the above VSWR threshold, the VSWR threshold ranges from 1 to 10.

6. The method according to claim 1, wherein RF signal frequencies of the pulse power loaded on the upper electrode and the lower electrode are the same, pulse signal frequencies are the same, and pulse signal duty cycles are the same.

7. An RF pulse device, comprising:
    an upper electrode including an upper RF power supply and a corresponding upper matching device;
    a lower electrode including a lower RF power supply and a corresponding lower matching device;
    a pulsing synchronization line connecting between the upper RF power supply and the lower RF power supply; and
    a pulse matching time sequence control line and a time sequence matching circuit being arranged between the upper matching device and the lower matching device, the time matching circuit including:
        a pre-processing circuit configured to preset a matching threshold and initialize a pulse count value to a pulse reference value;
        a loading circuit configured to collect a pulse signal of pulse power loaded by the upper RF power supply and calculate a matching parameter of the upper matching device according to the pulse signal;
        a determination circuit configured to determine a magnitude of the matching parameter relative to the matching threshold and reset the pulse count value according to the magnitude of the matching parameter relative to the matching threshold; and
        a matching circuit configured to cause the upper matching device to perform matching on the upper RF power supply or cause the lower matching device to perform the matching on the lower RF power supply according to consistency of the reset pulse count value and the pulse reference value.

8. The device according to claim 7, wherein the determination circuit is configured to perform a determination on the magnitude of the matching parameter relative to the matching threshold on a rising edge of each pulse period of the upper RF power supply, and reset the pulse count value to be maintained the same or change to a different value according to a determination result.

9. The device according to claim 7, wherein:
    the pre-processing circuit is configured to initialize the pulse reference value to a first constant;
    in response to determining that the matching parameter is greater than the matching threshold, the determination circuit is configured to reset the pulse count value to the first constant or a value having a same parity as the first constant;
    in response to determining that the matching parameter is less than the matching threshold, the determination circuit is configured to reset the pulse count value to a second constant, the second constant being not equal to the first constant or has a different parity from the first constant;
    in response to the pulse count value being equal to the pulse reference value or having a same parity with the pulse reference value, the upper matching device performs matching on the upper RF power supply; and in response to the pulse count value being not equal to the pulse reference value or having a different parity from the pulse reference value, the lower matching device performs matching on the lower RF power supply.

10. The device according to claim 7, wherein:

the matching threshold includes any one of a voltage standing wave ratio (VSWR) threshold, a reflection coefficient threshold, or an impedance threshold in the pre-processing circuit; and the matching parameter includes any one of a VSWR, a reflection coefficient, or an impedance of the corresponding upper matching device in the acquisition circuit.

11. The device according to claim 10, wherein when the matching threshold is the above the VSWR threshold, the VSWR threshold ranges from 1 to 10.

12. A pulse plasma generation system comprising an RF pulse device including:

an upper electrode including an upper RF power supply and a corresponding upper matching device;

a lower electrode including a lower RF power supply and a corresponding lower matching device;

a pulsing synchronization line connecting between the upper RF power supply and the lower RF power supply; and a pulse matching time sequence control line and a time sequence matching circuit being arranged between the upper matching device and the lower matching device, the time matching circuit including:

a pre-processing circuit configured to preset a matching threshold and initialize a pulse count value to a pulse reference value;

a loading circuit configured to collect a pulse signal of pulse power loaded by the upper RF power supply and calculate a matching parameter of the upper matching device according to the pulse signal;

a determination circuit configured to determine a magnitude of the matching parameter relative to the matching threshold and reset the pulse count value according to the magnitude of the matching parameter relative to the matching threshold; and a matching circuit configured to cause the upper matching device to perform matching on the upper RF power supply or cause the lower matching device to perform the matching on the lower RF power supply according to consistency of the reset pulse count value and the pulse reference value.

13. The system according to claim 12, wherein the determination circuit is configured to perform a determination on the magnitude of the matching parameter relative to the matching threshold on a rising edge of each pulse period of the upper RF power supply, and reset the pulse count value to be maintained the same or change to a different value according to a determination result.

14. The system according to claim 12, wherein:

the pre-processing circuit is configured to initialize the pulse reference value to a first constant;

in response to determining that the matching parameter is greater than the matching threshold, the determination circuit is configured to reset the pulse count value to the first constant or a value having a same parity as the first constant;

in response to determining that the matching parameter is less than the matching threshold, the determination circuit is configured to reset the pulse count value to a second constant, the second constant being not equal to the first constant or has a different parity from the first constant;

in response to the pulse count value being equal to the pulse reference value or having a same parity with the pulse reference value, the upper matching device performs matching on the upper RF power supply; and in response to the pulse count value being not equal to the pulse reference value or having a different parity from the pulse reference value, the lower matching device performs matching on the lower RF power supply.

15. The system according to claim 12, wherein:

the matching threshold includes any one of a voltage standing wave ratio (VSWR) threshold, a reflection coefficient threshold, or an impedance threshold in the pre-processing circuit; and the matching parameter includes any one of a VSWR, a reflection coefficient, or an impedance of the corresponding upper matching device in the acquisition circuit.

16. The system according to claim 12, wherein when the matching threshold is the above the VSWR threshold, the VSWR threshold ranges from 1 to 10.

* * * * *